US008717831B2

(12) United States Patent
Hadley

(10) Patent No.: US 8,717,831 B2
(45) Date of Patent: May 6, 2014

(54) MEMORY CIRCUIT

(75) Inventor: Ted A. Hadley, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 74 days.

(21) Appl. No.: 13/460,514

(22) Filed: Apr. 30, 2012

(65) Prior Publication Data

US 2013/0286756 A1    Oct. 31, 2013

(51) Int. Cl.
| | |
|---|---|
| *G11C 7/00* | (2006.01) |
| *G11C 8/00* | (2006.01) |
| *G11C 11/00* | (2006.01) |
| *G11C 7/22* | (2006.01) |
| *G11C 19/00* | (2006.01) |
| *G11C 19/28* | (2006.01) |

(52) U.S. Cl.
CPC ... *G11C 7/22* (2013.01); *G11C 19/00* (2013.01); *G11C 19/28* (2013.01)
USPC .............................. 365/189.08; 365/189.12

(58) Field of Classification Search
CPC .......... G11C 7/22; G11C 19/00; G11C 19/28; G11C 7/1078; G11C 7/1006
USPC ....................................... 365/189.12, 189.08
See application file for complete search history.

(56) References Cited

U.S. PATENT DOCUMENTS

| | | | | |
|---|---|---|---|---|
| 3,308,440 A | * | 3/1967 | Truitt et al. ................... 365/73 |
| 3,576,534 A | * | 4/1971 | Steinberger .................. 382/221 |
| 3,771,140 A | * | 11/1973 | Tromp ........................ 711/110 |
| 3,997,882 A | | 12/1976 | Goyal |
| 4,030,078 A | * | 6/1977 | Kluge ........................ 340/172.5 |
| 4,084,154 A | | 4/1978 | Panigrahi |
| 4,128,879 A | | 12/1978 | Gardner |
| 4,171,536 A | * | 10/1979 | Heuer et al. .................. 711/151 |
| 4,194,245 A | | 3/1980 | Pascoe et al. |
| 4,236,227 A | * | 11/1980 | Bull et al. .................. 365/49.17 |
| 4,363,125 A | * | 12/1982 | Brewer et al. ................ 714/824 |
| 4,665,551 A | * | 5/1987 | Sternberg et al. ............. 382/257 |
| 5,305,253 A | | 4/1994 | Ward |
| 5,343,439 A | | 8/1994 | Hoshino |
| 5,526,472 A | | 6/1996 | Strohacker |
| 5,612,693 A | | 3/1997 | Craft et al. |
| 6,061,417 A | | 5/2000 | Kelem |
| 7,107,392 B2 | | 9/2006 | Regev et al. |
| 7,949,912 B1 | | 5/2011 | Trimberger |
| 2003/0081769 A1 | | 5/2003 | Hamilton |
| 2004/0030853 A1 | * | 2/2004 | Welker et al. ................. 711/163 |
| 2005/0122794 A1 | | 6/2005 | Chard et al. |

(Continued)

FOREIGN PATENT DOCUMENTS

| | | |
|---|---|---|
| EP | 1117100 | 6/2001 |
| JP | 62299143 | 12/1987 |
| JP | 63113745 | 5/1988 |

OTHER PUBLICATIONS

International Searching Authority, Appl. No. PCT/US2012/068992, Filed Dec. 11, 2012, Search Report and Written Opinion, 10pp, dated Sep. 5, 2013.

*Primary Examiner* — Ly D Pham

(57) ABSTRACT

A memory circuit may include a shift register ring including single-bit shift registers. The circuit may include a clock connected to the shift registers to shift bits within the shift register ring, and a counter connected to the clock and indicating positions of the bits in the shift register ring.

14 Claims, 8 Drawing Sheets

(56) References Cited

U.S. PATENT DOCUMENTS

| | | |
|---|---|---|
| 2007/0220388 A1 | 9/2007 | Quereshi et al. |
| 2011/0302475 A1* | 12/2011 | Eisenhuth et al. ............ 714/763 |
| 2013/0054886 A1* | 2/2013 | Eshraghian et al. .......... 711/108 |

* cited by examiner

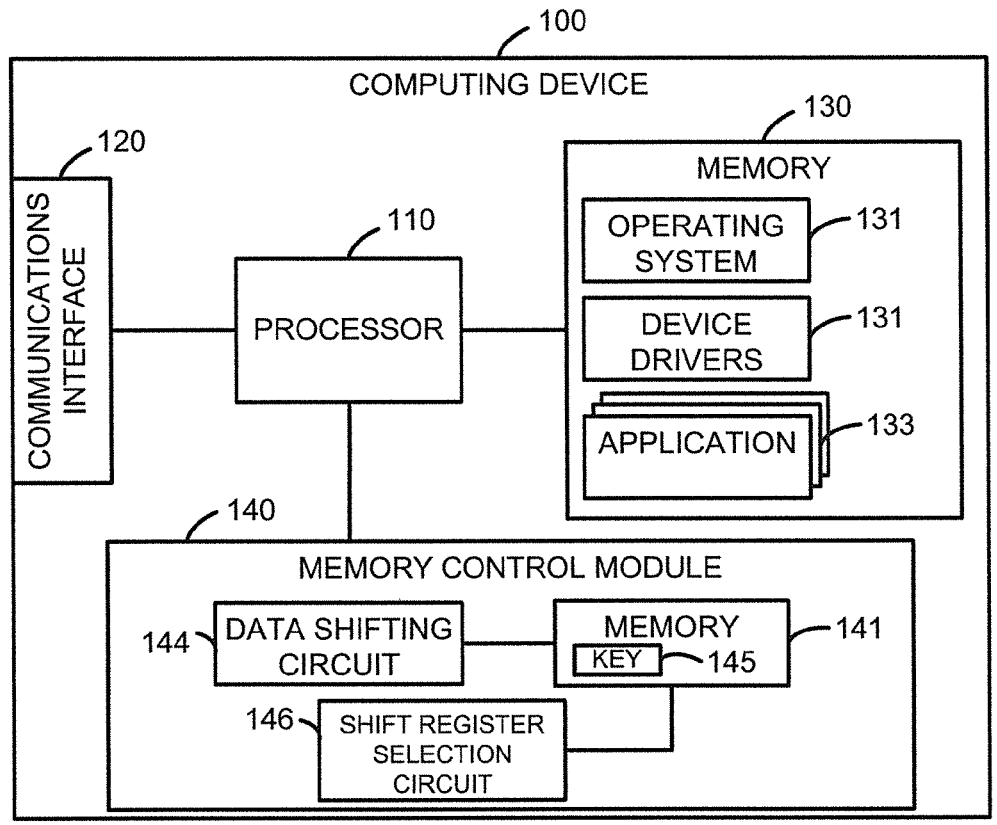
FIG. 1
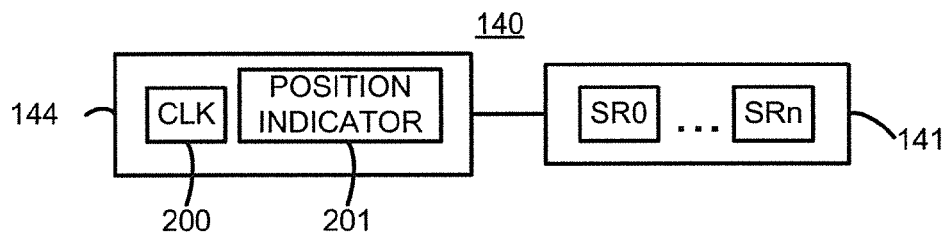
FIG. 2
| TABLE 300 | | | | | |
|---|---|---|---|---|---|
| | | SR0 | SR1 | SR2 | SR3 |
| HOME POSITION | T0 | D0 | D1 | D2 | D3 |
| | T1 | D3 | D0 | D1 | D2 |
| | T2 | D2 | D3 | D0 | D1 |
| | T3 | D1 | D2 | D3 | D0 |
| HOME POSITION | T4 | D0 | D1 | D2 | D3 |
FIG. 3

| D | W | Z | /PR | /CL | Description |
|---|---|---|-----|-----|-------------|
| X | 0 | 0 | 1 | 1 | When Write Enable is low, /PR and /CL are idle. |
| 0 | 1 | 0 | 1 | 0 | When writing a 0, /CL is asserted and /PR is idle. |
| 1 | 1 | 0 | 0 | 1 | When writing a 1, /PR is asserted and /CL is idle. |
| X | X | 1 | 1 | 0 | When zeroize is active, /CL is asserted and /PR is idle. |

600

FIG. 6

MEMORY CIRCUIT

BACKGROUND

Memories are used within computing devices to store data. For example, data is stored and accessed within computing devices such as personal computers, notebook and laptop computers, smartphones, personal digital assistants ("PDAs"), tablet and slate devices, personal entertainment devices such as MP3 players and media players, set-top boxes, gaming consoles, appliances, embedded devices, smart meters, and other computing devices at memories such as random-access memories ("RAMs").

Typically, data stored in RAM or other memory of a computing device is accessed by a processor and some operation is performed by the processor based on the data. For example, an encryption key can be stored at a memory and a processor can access the encryption key to encrypt or decrypt a document.

Sometimes data stored in memory does not change for literally years of operation. For example, an encryption key may be stored in the same memory locations over an extended period of time and is read many times but is never deleted or changed. When data is stored in the same memory locations over a long period of time, memory imprinting may occur due to various properties of the memory.

For example, typically, memory is comprised of a semiconductor device that stores information (or data values) based on a state (e.g., a charge value, resistance value, or some other state) of the memory cells, within the memory. Due to various properties of the memory such as manufacturing processes, types and amounts of dopants, temperature, composition, or other properties, storage of data (or data values) in the same memory locations over an extended period of time can alter the physical characteristics of the memory such that the data becomes imprinted in the memory cells. As a result of this memory imprinting, the data stored in the memory cells can be determined or read even after being deleted or overwritten or after volatile memory has been powered down. In other words, the memory can be susceptible to imprinting of the data. If the memory is in a computing device that was discarded after the data was deleted from the memory, an unauthorized user may still access the data from the computing device if the data was imprinted.

BRIEF DESCRIPTION OF DRAWINGS

The embodiments are described in detail with reference to the examples shown in the following figures:

FIG. 1 illustrates a computing device;
FIG. 2 illustrates a memory control module;
FIG. 3 illustrates a table showing shifting of bits to different positions;
FIG. 6 illustrates a truth table for the circuit shown in FIG. 5.

DETAILED DESCRIPTION OF EMBODIMENTS

Figure 4:
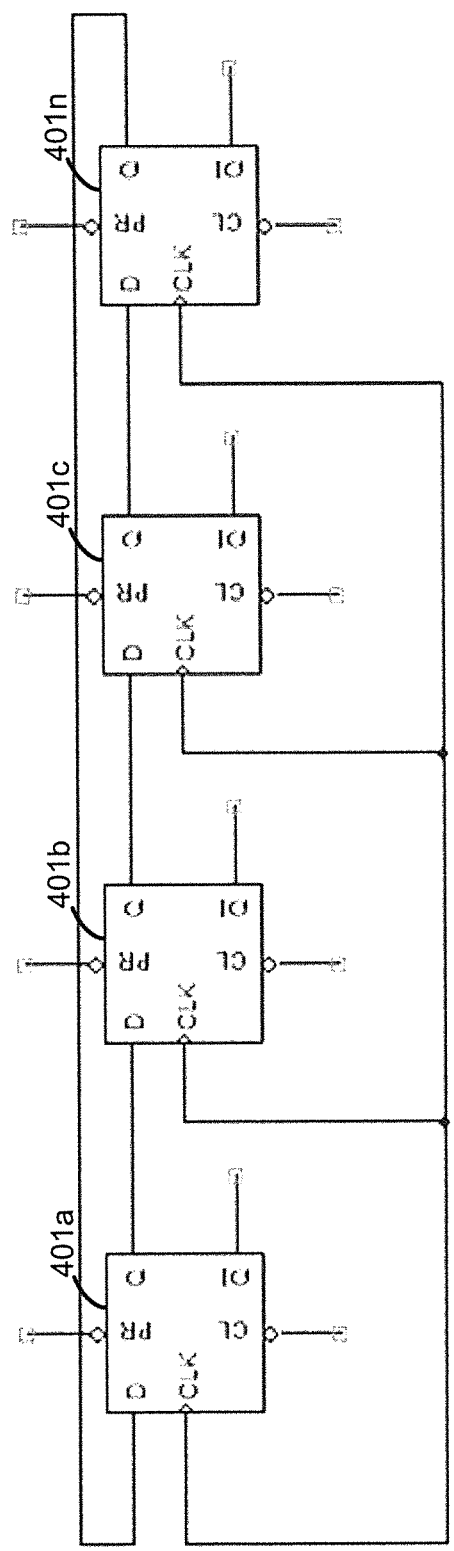
FIG. 4 illustrates memory cells comprised of flip-flops.

For simplicity and illustrative purposes, the principles of the embodiments are described by referring mainly to examples thereof. In the following description, numerous specific details are set forth in order to provide a thorough understanding of the embodiments. It is apparent that the embodiments may be practiced without limitation to all the specific details. Also, the embodiments may be used together in various combinations.

Data values of a data set stored at various memory cells of a memory are periodically moved to other memory cells of that memory. The periodic movement of the data minimizes the possibility of memory imprinting for example by preventing the prolonged exposure of memory cells to a particular data value.

A memory for storing the data may include a bit-oriented architecture. For example, the memory may include a shift register ring comprised of a storage array of single-bit flip-flops, each to store a single bit of data. When shifting words of data through memory, the quality of the non-imprinting is related to the Hamming distance amongst all of the values. For example, if a logic 1 exists in the same position of most of the words of data, that location suffers reduced non-imprinting effectiveness if data is moved byte-by-byte to different memory locations. The shift register ring, however, may shift all the bits sequentially through the storage array and each bit carries equal effectiveness for non-imprinting, as opposed to shifting entire words byte-by-byte to different memory locations which may suffer from reduced non-imprinting effectiveness.

FIG. 1 illustrates a computing device 100 that includes a memory control module 140 with a memory 141. The memory 141 may include a physical device, such as semiconductor memory, comprised of memory cells to store data. In one example, the memory cells comprise shift registers as further described below. The computing device 100 also includes processor 110, communication interface 110, and storage device 130. The processor 110 is any of a variety of processors. For example, the processor 110 can be a general-purpose processor or an application-specific processor implemented as a hardware module and/or a software module hosted at a hardware module. A hardware module can be, for example, a microprocessor, a microcontroller, an application-specific integrated circuit ("ASIC"), a programmable logic device ("PLD") such as a field programmable gate array ("FPGA"), and/or other electronic circuits that perform operations. A software module can be, for example, instructions, commands, and/or codes stored at a memory and executed at another processor. Such a software module can be defined using one or more programming languages such as Java™, C++, C, an assembly language, a hardware description language, and/or another suitable programming language. For example, a processor can be a virtual machine hosted at a computer server including a microprocessor and a memory.

In some implementations, the processor 110 can include multiple processors. For example, the processor 110 can be a microprocessor including multiple processing engines (e.g., computation, algorithmic or thread cores). As another example, the processor 110 can be a computing device including multiple processors with a shared clock, memory bus, input/output bus, and/or other shared resources. Furthermore, the processor 110 can be a distributed processor. For example, the processor 110 can include multiple computing devices, each including a processor, in communication one with another via a communications link such as a computer network.

The processor 110 is operatively coupled to the communications interface 120, the storage device 130, and the memory control module 140. The storage device 130 may store machine readable instructions or codes (e.g., computer codes or object codes) defining software modules that are executed by the processor 110 during operation of computing device 100. For example, the storage device 130 includes instructions that define operating system 131, device drivers 131, and applications 133 (e.g., software application programs). In other words, the operating system 131, the device drivers 131, the applications 133, and other software modules stored as instructions (not shown) at the storage device 130 and executed at the processor 110 are hosted at the computing device 100. The applications 133 can include, for example, an application software module, a hypervisor, a virtual machine module, or an environment such as a runtime environment or virtual machine instance. As a specific example, the applications 133 can include a cryptographic service such as a file encryption application.

The storage device 130 may include volatile memory and/or non-volatile (or non-transient) memory or processor-readable medium (not shown) such as a hard disk drive ("HDD"), a solid-state drive ("SSD"), a FLASH drive, or is in communication with a data storage service (e.g., via communications interface 120 and a communications link such as a communications network) at which software applications (e.g., computer codes or instructions that implement software applications when executed at a processor), data, or combinations thereof can be stored and accessed by the processor 110. Such software applications, data, or combinations thereof can be moved or copied to the storage device 130 by the processor 110 and accessed by the processor 110 at the storage device 130 during operation of the computing device 100.

Examples of processor-readable media include, but are not limited to: magnetic storage media such as a hard disk, a floppy disk, and/or magnetic tape; optical storage media such as a compact disc ("CD"), a digital video disc ("DVDs"), a compact disc read-only memory ("CD-ROM"), and/or a holographic device; magneto-optical storage media; non-volatile memory such as read-only memory ("ROM"), programmable read-only memory ("PROM"), erasable programmable read-only memory ("EPROM"), electronically erasable read-only memory ("EEPROM"), and/or FLASH memory; and random-access memory ("RAM"). Examples of computer code include, but are not limited to, micro-code or micro-instructions, machine instructions, such as produced by a compiler, and files containing higher-level instructions that are executed by a computer using an interpreter. For example, an implementation may be implemented using Java™, C++, or other object-oriented programming language and development tools. Additional examples of computer code include, but are not limited to, control signals, encrypted code, and compressed code.

The communications interface 120 is comprised of one or more interfaces accessible to the processor 110 to communicate with (i.e., transmit symbols representing data to and receive such symbols from) other processors or computing devices via a communications link. In other words, the communications interface 120 can receive data from the processor 110 and transmit symbols representing the data via a communications link. Moreover, the communications interface 120 can receive symbols from other communications interfaces via a communications link and send data represented by those symbols to processor 110. For example, the communications interface 120 can be a telephone network interface, a twisted-pair network interface, a coaxial network interface, a fiber-optic network interface, a wireless network interface such as a wireless local area network ("WLAN") or a cellular network, a universal serial bus and/or some other network or communications interface.

The memory control module 140 includes data shifting circuit 144, memory 141 and shift register selection circuit 144. An encryption key 145 is shown as stored in the memory 141 as an example of data that may be stored in the memory 141. However, any data may be stored in the memory 141. The data shifting circuit 144 includes circuitry to prevent memory imprinting at the memory 141. The data shifting circuit 144 periodically moves the key 145 (i.e., data values of key 145) within the memory 141 to prevent memory imprinting of the key 145 in the memory 141. The shift register selection circuit 144 selects memory cells in the memory 141 corresponding to the current position of the bits stored in the memory 141 to read/write data to the memory cells. For example, the key 145 is periodically shifted by the data shifting circuit 144 and the shift register selection circuit 144 determines the current position of the key 145 in the memory cells of the memory 141 to allow the key to be read from the memory 141 or to allow a new key to be written to the memory 141.

The memory control module 140 may be provided on the same integrated circuit as the processor 110 or the memory control module 140 may be provided on a separate integrated circuit. The memory control module 140 may be part of the computing device 100 or may be on a separate device which may be connected to the computing device 100 via the communications interface 120, such as a universal serial bus port, a network interface, etc. Also, the memory 141 may also be referred to a memory circuit. For example, the memory 141 is comprised of semiconductor devices on an integrated circuit.

FIG. 2 shows the memory 141 comprised of shift registers SR0-SRn where n is an integer greater than or equal to 1. A shift register may include a single-bit register that stores a single bit and is an example of a memory cell. The shift registers may be connected as a shift-register ring where the output of one is connected to the input of another so each bit can be periodically shifted from one shift register to the other.

The data shifting circuit 144 may include a clock 200 and a position indicator 201. Instead of having its own clock, the data shifting circuit 144 may use the clock pulse generated by a clock used by another circuit. The position indicator 201 indicates the positions of bits in the shift registers as the bits are periodically shifted. In one example, the position indicator 201 comprises a counter as is further described below.

The shifting may be performed on a clock pulse generated by the clock 200 or another clock, and an example of the shifting is represented in table 300 shown in FIG. 3. For example, data stored in the shift registers in the shift-register ring is comprised of bits D0-D3 and assume the bits are written to the memory 141 and are in a home position at a time T0. The home position may be the locations of a set of bits (which may be word of predetermined length) after they are all written to the memory 141 but before the bits are shifted. For example, the home position is when bits D0-D3 are stored in the shift registers SR0-SRn respectively. At a first clock pulse after T0, shown as T1, the bits are shifted by one bit to the right. Thus at T1, D0 is shifted into SR1; D1 is shifted into SR2; D2 is shifted into SR3; and D3 is shifted into SR0. At a second clock pulse at T2, the bits are shifted again. Thus, at T2, D0 is shifted into SR2; D1 is shifted into SR3; D2 is shifted into SR0; and D3 is shifted into SR1. At a third clock pulse at T3, the bits are shifted again. Thus, at T3, D0 is shifted into SR3; D1 is shifted into SR0; D2 is shifted into SR1; and D3 is shifted into SR2. At T4, the bits are shifted back to the home position.

FIG. 4 illustrates an example of the shift registers in the memory 141. The shift registers may include an array of D flip-flops 401a-401n sharing the same clock and connected to form a shift register ring. Each flip-flop has a Q data output connected to a D input of another flip-flop. The Q output of the flip-flop is the data output for each bit position.

Figure 5:
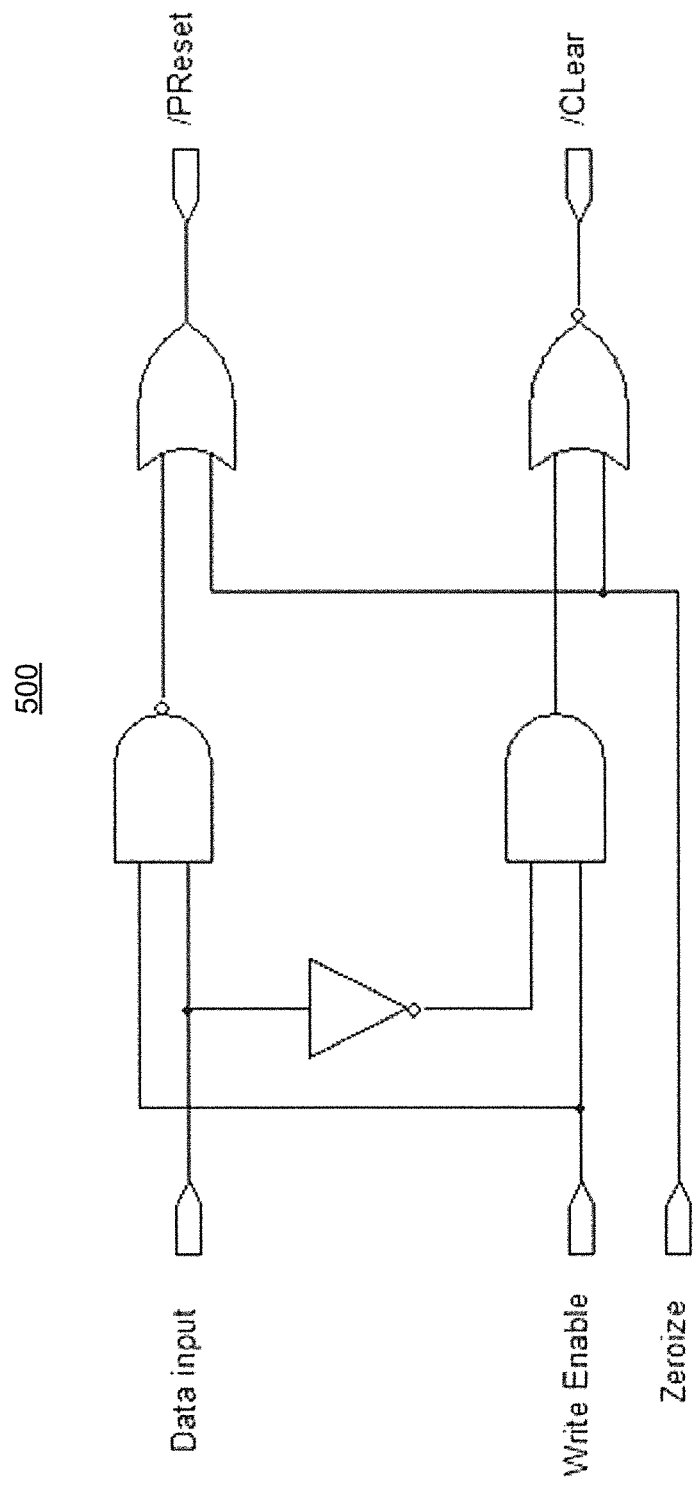
FIG. 5 illustrates a circuit to control inputs for a flip-flop.

Each flip-flop has PReset an CLear inputs, and these inputs may be active low. FIG. 5 shows an example of a circuit 500 for controlling the PR and CL inputs and the writing of data to a flip-flop. The circuit 500 may be included in the memory control module 140 shown in FIG. 1. To write a '1' bit to the D flip-flop, the PR is set to 0 (e.g., active low) and the CL is set to 1 (e.g., also active low). Following a write cycle, both PR and CL are set to 1 (the idle state). Writing a 0 is the same except PR is set to 1 and CL is set to 0. Also, a zeroize operation may be performed to reset the flip-flop data to 0 and the zeroize input may be connected to all flip-flops at once to reset all the flip-flops to 0 simultaneously. FIG. 6 shows a table 600 that is the truth table for controlling PR and CL and write operations which reiterates the description above for FIG. 5.

Figure 7:
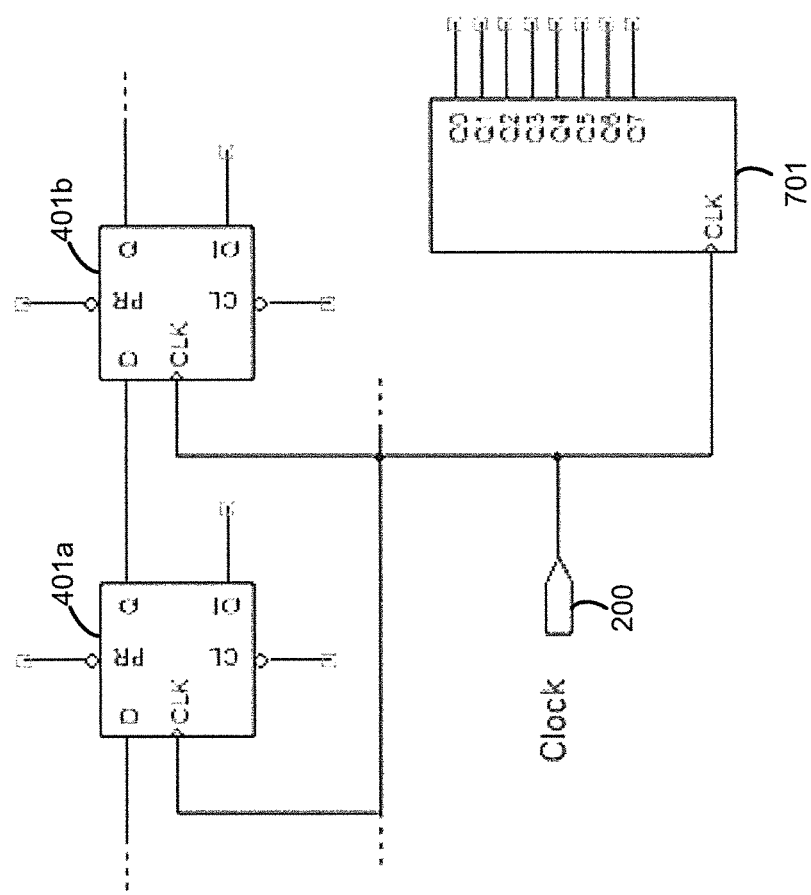
FIG. 7 illustrates a position indicator circuit.

FIG. 7 shows the clock 200 and a counter 701 that may operate as the position indicator 201 from FIG. 2. The counter 701 keeps track of the actual data position, such as the data positions shown in FIG. 3. For example, a counter value 0 means the bits are in the home position; after a shift, the counter 701 is incremented and the counter value 1 means the bits are in a position associated with T1 shown in FIG. 3, and so on. The number of bits in the shift registers should be of count $2^x$, where x is the number of bits in the counter.

Figure 8:
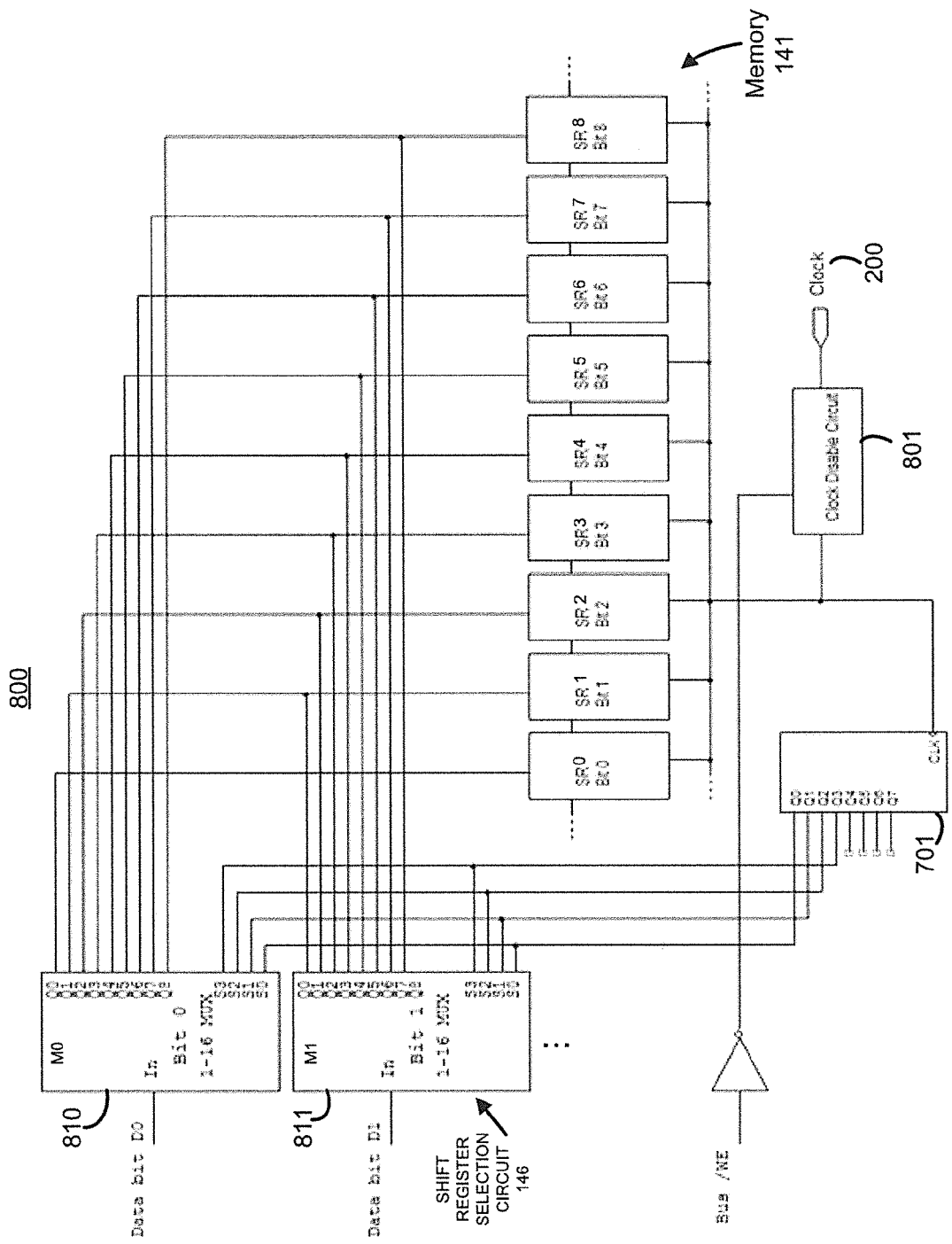
FIGS. 8-9 illustrate circuit examples for the memory control module.

FIG. 8 shows an example of a circuit 800 for the memory control module 140 shown in FIG. 1. The data shifting circuit 144 of FIG. 1 may include the clock 200, the counter 701 and clock disable circuit 801. The clock disable circuit inhibits propagation of the clock signal generated by the clock 200 to prevent shifting for example when a write is being performed. The Bus/WE (write-enable) signal to control the clock disable circuit 801 to inhibit propagation of the clock signal may be controlled by the processor 110 or other controller.

The memory 141 shown in FIG. 1 may include memory cells comprised of shift registers as described above. FIG. 8 shows some of the shift registers SR0 to SR8. In one example, the shift registers in FIG. 8 are comprised of D flip-flops such as shown in FIG. 4. The number of shift registers may be at least as many as the number of bits that are to be stored in the memory 141 but there may be more shift registers than number of bits. The shift registers for example are connected as a shift register ring.

The shift register selection circuit 146 shown in FIG. 1 may comprise multiplexers to read and/or write data to different shift registers. Examples of some of the multiplexers are shown as 810 and 811 in FIG. 8. The multiplexers for the shift register selection circuit 146 may provide nearly instantaneous access to any bit or group of bits (i.e., byte, word, etc.).

In the example shown in FIG. 8, assume the memory 141 holds 4 words of 4 bits each (16 bits total storage). In this example where the memory 141 stores 16 bits, the circuit 800 represents a partial view of the circuit for the memory control module 140. For example, for 16-bit storage, the circuit 800 comprises at least 16 shift registers but may include more. Also, a multiplexer may be provided for each shift register, so the circuit 800 would include for this example multiplexers M0-M15. Also, if there are 16 shift registers, each multiplexer may have 16 outputs, such as Q0-Q15. Also, the number of selector bits in each multiplexer and the number of bits in the counter 701 has to be at least x number of bits, whereby the number of shift registers (e.g., which may correspond to the number of bits being stored in the memory 141) is equal to $2^x$. For example, for a 16-bit storage, x=4. Thus, the number of selector bits for each multiplexer is 4, such as S0-S3, and the counter has at least 4 bits so the counter can be used to count to 16 (or 0 to 15) which is used to select any of the 16 shift registers.

The selection of the multiplexers, including the multiplexers 810 and 811, is the S inputs which are shown as S[3 . . . 0]. For example, when S[3 . . . 0]=0, the input is connected to the Q0 output. Similarly, when S=1, Q1 is the output, and so on. Thus, for example, each multiplexer includes a selector connected to the counter 701 to select a corresponding output of each multiplexer to read/write data bits to/from the shift registers SR0-SRn according to a current position indicated by a current value of the counter. For example, the multiplexer 810 includes outputs Q0-Q8 connected to shift registers SR0-SR8, respectively. The multiplexer 811 includes outputs Q0-Q7 connected to shift registers SR1-SR8, respectively, and so on for each other multiplexer that would be included in the circuit 800 for the 16 bits of storage. If the counter 200 outputs a 3 to the select lines, then Q3 is selected for each multiplexer. Then, bits may be read from or written to the shift registers corresponding to Q3. For example, Q3 for multiplexer 810 is connected to SR3, and Q3 for multiplexer 811 is connected to SR4, and the bits in these shift registers may be read via the multiplexers 810 and 811 assuming they are bi-directional multiplexers or the bits may be written to each of the shift registers connected to the Q3 outputs of the multiplexers 810 and 811. The Q outputs of the multiplexers may be connected to the D inputs and/or the Q outputs of the D flip-flops of the shift registers.

As indicated above, the read operation is synchronized with the counter 701 to simultaneously read the bits from the shift registers. Continuing with the 16-bit data storage example described above, assume there are 16 bits D0-D15 stored in the shift registers SR0-SR15. SR9-SR15 are not shown and also bits D2-D15 and multiplexers M2-M15 for bits D2-15 are not shown because this is a partial view of the circuit 800 for this example. The bits D0-D15 are initially written into the shift registers, and at their home position, prior to any shifting, the bits D0-D15 are stored in SR0-SR15 respectively. As discussed above, when the bits are shifted, the counter keeps track of the bit position. For example, the counter 701 indicates the current position of the 16 bits as they are shifted on each clock pulse. For data bit shifting in the circuit 800, when the counter 701 indicates home position for a counter value of 0, D0-D15 are stored in SR0-SR15 respectively. On the next clock pulse, the counter 701 is incremented to a value of 1, and all values in the shift registers are moved to the right one place, such that D0-D14 are stored in SR1-SR15 respectively and D15 is stored in SR0. The shifting continues on each clock pulse and the counter 701 is incremented on each clock pulse to keep track of the current bit position.

Assume the counter 701 is at 2, and the processor 110 shown in FIG. 1 wants to read D0-D15 stored in the memory 141. D0-D15 may be read through the multiplexers for example if they are bidirectional. For example, the current value of the counter 701 is 2, which selects a value of 2 on the select inputs S0-S3 of each of the multiplexers M0-M15. This causes the output Q2 to be selected on each of the multiplexers M0-M15. The output Q2 of each of the multiplexers M0-M13 are connected to SR2-SR15 respectively, and Q2 for M14-M15 are connected to SR0-SR1 respectively. Assuming M0-M15 are enabled to read, for example by a signal from the processor 110, D0-D15 are then read from their current positions in the shift registers. A write may be performed in the same way. For example, if the counter is at 2, and D0-D15 are to be overwritten, the processor 110 provides new values for D0-D15 to the multiplexers M0-M15 and the values are written to the shift registers via the Q2 outputs of M0-M15.

Figure 9:
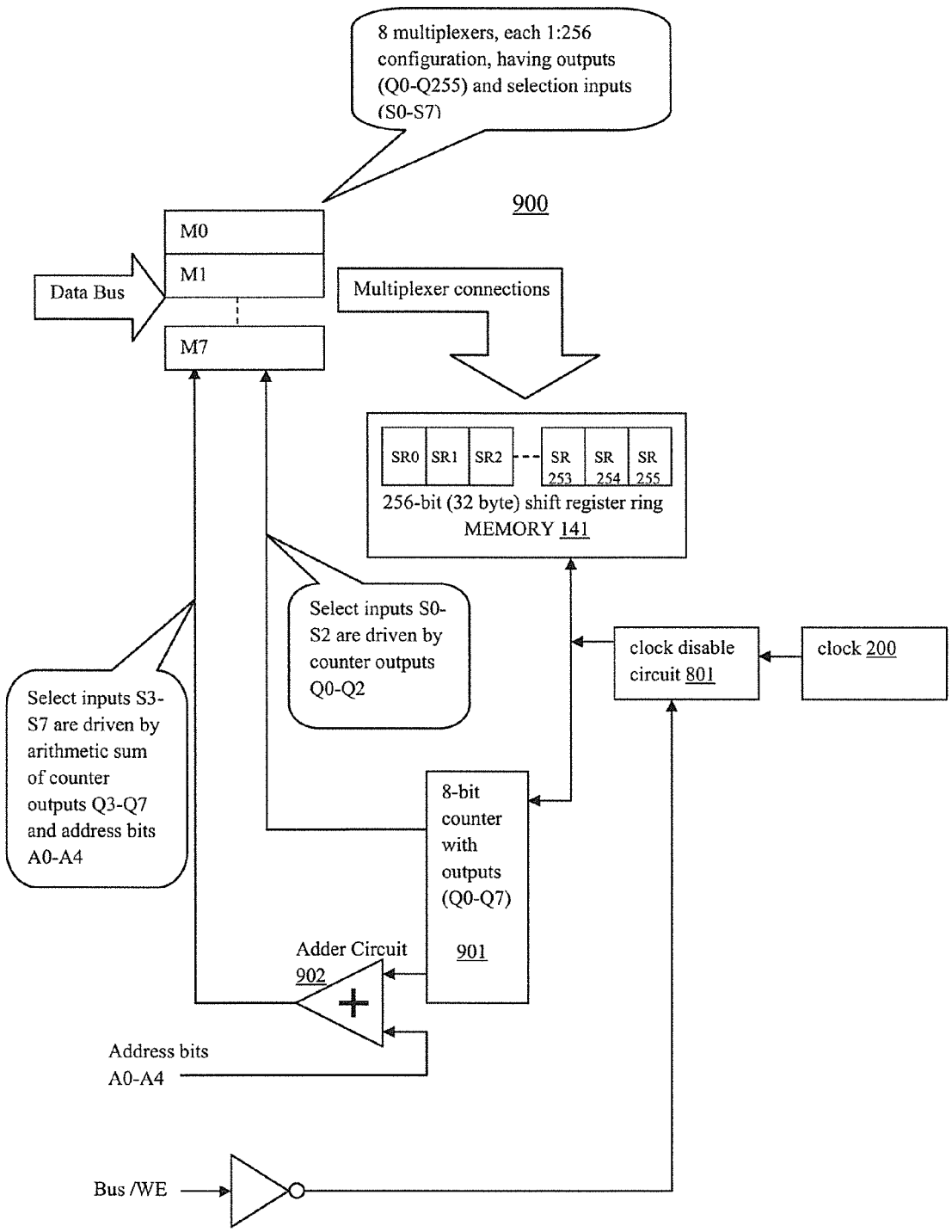

In the example shown in FIG. 8, there is a multiplexer for each bit, and each multiplexer is in turn connected to each bit, and the counter 701 controls all of the multiplexers simultaneously. In another example, the number of multiplexers is the number of bits in a word, e.g., 8 (byte), 16, 32, etc. In this example, when the processor 110 wishes to address different bytes (words, ...), the upper select bits of the multiplexers are controlled by the address bus by summing the address at a position $\log_2 k$, where k is the number of bits in the microprocessor native word, above S0. FIG. 9 shows a circuit 900 for this example. Assume the native word size of the microprocessor is 8 bits ("byte-wide"). The size of the memory 141 is 32 bytes so it can store 256 bits. There are 256 shift registers SR0-SR255. The counter 901 has $\log_2 256 = 8$ bits (Q0-Q7). There are 8 multiplexers M0-M7. Each multiplexer has 256 outputs (Q0-Q255) and 8 selection lines (S0-S7). Assume the memory addressing for the memory 141 starts at address $1000, which is a hexadecimal value. Being 32 bytes long, the memory address space occupied by the circuit 900 is the range from $1000 ... $101F given by 13 address bits A0-A12, which may be used by the processor 110 or another circuit to address a memory location. The low-order 5 address bits, A0-A4, select the bytes in the memory given by this example.

The low-order $\log_2$(bit width) bits are used to select a byte in the shift registers. In this example, the bit width is 8 bits, so $\log_2 8 = 3$ bits. The low-order 3 counter bits Q0-Q2 are connected to the multiplexer select lines S0-S2 of each multiplexer M0-M7. Five counter bits remain, Q3-Q7 of counter 901. An adder circuit 902 adds the 5 upper position counter bits, Q3-Q7 of counter 901, to the 5 low-order address bits A0-A4. The result of this addition drives the 5 upper multiplexer select bits S3-S7. In other words the output of the adder circuit 902 is input in binary form to multiplexer select bits S3-S7 of each multiplexer M0-M7.

The counter 901 now provides two values. The first value, given by the low order bits Q0-Q2 of counter 901, selects the position of the bits of the input word into the shift register position. The upper position counter value, Q3-Q7 of counter 901, provides an offset to the location of those bits within the array. Stated differently, the low order bits of the counter 901 establish the alignment of a group of 8 bits (a byte) within the shift registers, while the upper bits of the counter 901 select the correct one of a plurality of aligned bytes. In this example, the processor 110 has the ability to select any of the bytes, and its address is simply the offset into the selection.

Figure 10:
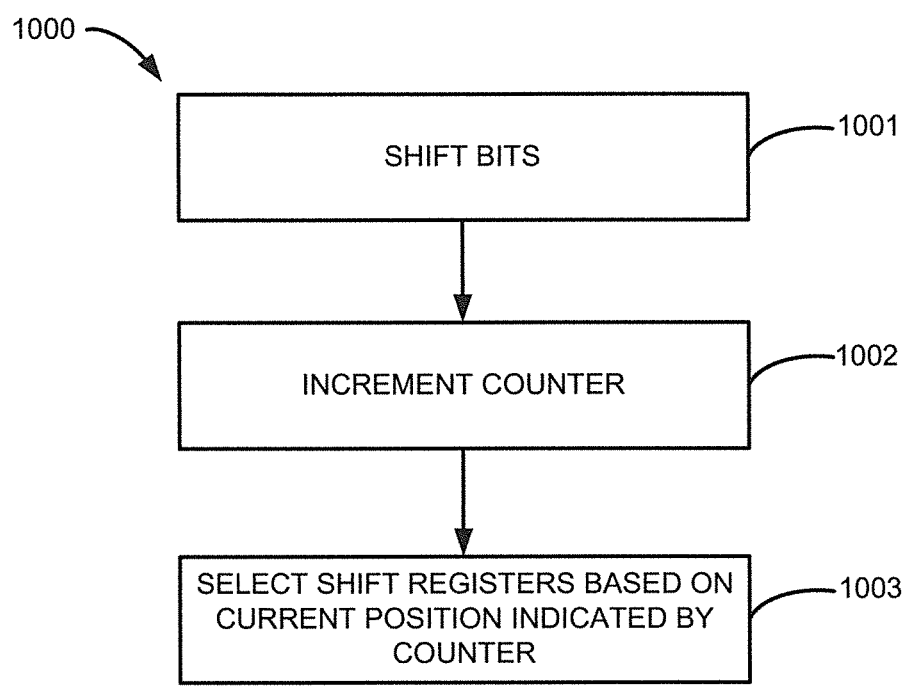
FIG. 10 illustrates a method.

FIG. 10 illustrates a method 1000. The method 1000 may be performed by the memory control module 140 shown in FIGS. 1, 8 and/or 9. At 1001, bits are shifted in a shift register ring for each clock pulse generated by a clock. At 1002, a counter is incremented by one for each clock pulse unless the bits are in a home position, and then the counter is reset to 0, wherein the counter indicates a current position of the bits in the shift ring. At 1003, shift registers in the shift register ring are selected based on a current position indicated by the counter to read or write data to the shift registers.

While the embodiments have been described with reference to examples, various modifications to the described embodiments may be made without departing from the scope of the claimed embodiments.

What is claimed is:

1. A memory circuit comprising:
a shift register ring including single-bit shift registers;
a clock connected to the shift registers to shift bits within the shift register ring;
a counter connected to the clock and indicating positions of the bits in the shift register ring; and
a clock disable circuit connected to an output of the clock to inhibit a clock propagation to the counter and the shift registers when writing to the shift registers.

2. The circuit of claim 1, comprising:
a shift register selection circuit connected to the counter and the shift registers to select a shift register based on a position indicated by the counter.

3. The circuit of claim 2, wherein the shift register selection circuit comprises a multiplexer including a selector connected to the counter and outputs connected to the shift registers, wherein a counter value from the counter selects an output of the multiplexer corresponding to a current position of the bits.

4. The circuit of claim 2, wherein the bits include bits D0-Dn, the shift registers includes shift registers SR0-SRn, the shift register selection circuit includes a multiplexer for each bit D0-Dn, and each multiplexer includes a selector connected to the counter to select a corresponding output of each multiplexer to read or write the bits D0-Dn from the shift registers SR0-SRn according to a current position of the bits D0-Dn indicated by a current value of the counter.

5. The circuit of claim 4, wherein each multiplexer includes outputs Q0-Qn connected to a corresponding set of the shift registers to read or write the bits D0-Dn from the shift registers SR0-SRn according to the current position of the bits D0-Dn indicated by the current value of the counter.

6. The circuit of claim 5, wherein the outputs Q0-Qn for the multiplexer for D0 are connected to the shift registers SR0-SRn respectively, the outputs Q0-Qn−1 for the multiplexer for D1 are connected to the shift registers SR1-SRn−1 respectively, and so on for each of the multiplexers for each bit D0-Dn wherein the output Q0 for the multiplexer for Dn is connected to the shift register SRn.

7. The circuit of claim 2, wherein each shift register comprises a D flip-flop storing only a single bit of data, and the shift register selection circuit is connected to the input and the output of each D flip-flop to read or write data from the flip-flops.

8. The circuit of claim 1, wherein each shift register includes a zeroize input and each shift register is to simultaneously receive a zeroize active signal to reset each bit stored in the shift registers simultaneously.

9. The circuit of claim 1, wherein for each clock pulse generated by the clock, each bit is shifted to a next shift register in the ring, and the counter is incremented by one unless the bits are in a final position, and then the counter is reset to 0.

10. A circuit comprising:
a clock connected to single-bit shift registers in a shift register ring to shift bits within the shift register ring;
a counter connected to the clock and indicating a current position of the bits in the shift register ring; and
a shift register selection circuit connected to the counter and the shift registers to select shift registers based on a position indicated by the counter,
wherein for each clock pulse generated by the clock, each bit is shifted to a next shift register in the ring, and the counter is incremented by one unless the bits are in a final position, and then the counter is reset to 0.

11. The circuit of claim 10, wherein the bits include bits D0-Dn, the shift registers includes shift registers SR0-SRn, the shift register selection circuit includes a multiplexer for each bit D0-Dn, and each multiplexer includes a selector connected to the counter to select a corresponding output of each multiplexer to read or write the bits D0-Dn from the shift registers SR0-SRn according to a current position of the bits D0-Dn indicated by a current value of the counter.

12. The circuit of claim 10, wherein the shift register selection circuit comprises N number of multiplexers, wherein N is a number of bits in a word, and the counter has N number of counter bits, and a number of low order bits of the counter comprised of log 2N select a word in the shift registers, and the remaining bits in the counter represent an offset into the selected word.

13. A method of shifting bits in a shift register ring including single-bit shift registers comprising:
   shifting the bits in the shift register ring for each clock pulse generated by a clock;
   incrementing a counter by one for each clock pulse unless the bits are in a home position, and then resetting the counter to 0, wherein the counter indicates a current position of the bits in the shift register ring; and
   selecting a shift register based on a current position indicated by the counter to read or write data to the shift registers.

14. The method of claim 13, comprising:
   using a clock disable circuit connected to an output of the clock to inhibit a clock propagation to the counter and the shift registers when writing to the shift registers.

* * * * *